United States Patent [19]

Nakatani

[11] Patent Number: 5,202,286

[45] Date of Patent: Apr. 13, 1993

[54] METHOD OF FORMING THREE-DIMENSIONAL FEATURES ON SUBSTRATES WITH ADJACENT INSULATING FILMS

[75] Inventor: Mitsunori Nakatani, Itami, Japan

[73] Assignee: Mitsubishi Denki Kabushiki Kaisha, Tokyo, Japan

[21] Appl. No.: 745,229

[22] Filed: Aug. 14, 1991

Related U.S. Application Data

[63] Continuation-in-part of Ser. No. 452,044, Dec. 18, 1989, abandoned.

[51] Int. Cl.⁵ .......................................... H01L 21/44
[52] U.S. Cl. .................................. 437/181; 437/235; 437/944; 148/DIG. 100
[58] Field of Search ....................... 437/944, 181, 235; 148/DIG. 100

[56] References Cited

U.S. PATENT DOCUMENTS

| | | | |
|---|---|---|---|
| 4,253,888 | 3/1981 | Kikuchi | 148/187 |
| 4,268,951 | 5/1981 | Elliott et al. | 29/571 |
| 4,503,600 | 3/1985 | Nii et al. | 437/944 |
| 4,599,137 | 7/1986 | Akiya | 156/646 |
| 4,601,097 | 7/1986 | Shimbo | 437/200 |
| 4,685,195 | 8/1987 | Szydlo et al. | 437/41 |
| 4,824,800 | 4/1989 | Takano | 437/180 |
| 4,859,618 | 8/1981 | Shikata et al. | 437/41 |
| 5,068,207 | 11/1991 | Manocha et al. | 437/231 |

FOREIGN PATENT DOCUMENTS

| | | |
|---|---|---|
| 0063916 | 11/1982 | European Pat. Off. . |
| 0063917 | 11/1982 | European Pat. Off. . |
| 075875 | 4/1983 | European Pat. Off. . |
| 0162774 | 11/1985 | European Pat. Off. . |
| 2431768 | 2/1980 | France . |
| 24937 | 3/1981 | Japan . |
| 53842 | 3/1983 | Japan . |
| 196958 | 10/1985 | Japan . |
| 196959 | 10/1985 | Japan . |
| 54641 | 3/1986 | Japan . |
| 195190 | 8/1987 | Japan . |
| 138727 | 6/1988 | Japan . |
| 005913 | 4/1979 | United Kingdom . |
| 2059679 | 4/1981 | United Kingdom . |
| 104723 | 3/1983 | United Kingdom . |

OTHER PUBLICATIONS

Ghandhi, "VLSI Fabrication Principles", 1983, pp. 487–490 and p. 570.
Ehara et al, "Planar Interconnection Technology For LSI Fabrication Utilizing Lift–Off Process", Journal of the Electrochemical Society, vol. 131, No. 2, 1984, pp. 419–424.
Eng. abstract of Tano JP 63-138727.
Eng. abstract of Kurosawa et al. JP 58-53842.
Eng. abstract of FR 2,431,768.
S. Wolf, Silicon Processing for the VLSI Era, vol. 2, Lattice Press, Sunset Beach, 1990, pp. 237–238.

Primary Examiner—Brian E. Hearn
Assistant Examiner—Laura M. Holtzman
Attorney, Agent, or Firm—Leydig, Voit & Mayer

[57] ABSTRACT

A method of producing a three-dimensional feature on a substrate and adjacent electrically insulating films comprising producing a resist on a portion of a surface of a substrate; etching the substrate to remove portions of the substrate not covered by the resist, leaving an etched surface on part of the substrate, and producing a three-dimensional feature having side walls intersecting the etched surface of the substrate underlying and undercutting the resist so that the resist includes overhanging portions spaced from the etched surface of the substrate, the three-dimensional feature having a height between the resist and the etched surface of the substrate; depositing, in a chemical vapor deposition process at a relatively low temperature, a discontinuous electrically insulating film to a thickness no greater than the height of the three-dimensional feature in a first segment on the resist and in a second segment, discontinuous from the first segment, on the etched surface of the substrate adjacent the three-dimensional feature, including on the etched surface of the substrate between the etched surface of the substrate and the overhanging portions of the resist; and lifting off the resist and the first segment of the insulating film disposed on the resist to produce a flattened surface including the second segment of the insulating film and the three-dimensional feature.

16 Claims, 9 Drawing Sheets 5,202,286

METHOD OF FORMING THREE-DIMENSIONAL FEATURES ON SUBSTRATES WITH ADJACENT INSULATING FILMS

This disclosure is a continuation-in-part application of United States patent application Ser. No. 07/452,044, filed Dec. 18, 1989, now abandoned.

FIELD OF THE INVENTION

The present invention concerns a method of producing three-dimensional features on semiconductor and insulating substrates with insulating films disposed on the substrates adjacent to the three-dimensional features. The method is particularly useful in producing semiconductor devices and appliances for use in the production of semiconductor devices, such as phase-shifting masks.

BACKGROUND OF THE INVENTION

FIGS. 5(a)–5(e) are cross-sectional views illustrating a process for producing a monolithic microwave integrated circuit (MMIC). In the process, a number of MMICs are simultaneously prepared and are separated or isolated from each other by etching through an active layer that is initially common to all of the MMICs.

As shown in FIG. 5(a), a gallium arsenide substrate 1 has disposed on it or as part of it an active layer 5. The active layer 5 is formed by epitaxially growing gallium arsenide on the substrate 1 or by ion implantation of the substrate 1. A photoresist film 3 is disposed on part of the active layer 5 where a field effect transistor (FET) is to be formed.

As shown in FIG. 5(b), using the photoresist film 3 as a mask, the substrate 1 and the active layer 5 are etched, electrically separating a portion of the active layer 5 from other similar regions on the common substrate 1. In the etching step, a three-dimensional feature, a forward mesa structure with side walls 2a and 2b, is formed. The forward mesa side walls 2a and 2b diverge in the direction of the substrate 1 from the active layer 5 and converge in the direction of the active layer 5 from the substrate 1.

The photoresist film 3 is removed and, as shown in FIG. 5(c), source electrodes 6a–6c and drain electrodes 7a and 7b, all ohmic electrodes, are deposited on the active layer 5. The source electrodes 6a and 6c extend along the respective side walls 2a and 2b and reach the substrate 1. After the formation of the source and drain electrodes, a photoresist film 8 is deposited over the electrodes, the active layer 5, and the substrate 1.

The photoresist film 8 is patterned by conventional photolithographic techniques to define locations of gate electrodes between respective source and drain electrodes. As shown in FIG. 5(d), recesses 10 are opened at each of the patterned locations in the photoresist film and extend into the active layer 5. The recesses 10 in the active layer 5 are formed by wet etching, for example, by using tartaric acid.

In the final steps of the process, illustrated in FIG. 5(e), the metal employed for the gate electrodes is vapor-deposited on the photoresist film and in the respective recesses 10 to form gate electrodes 9. The excess metal that is deposited on the photoresist film 8 is removed by a lift-off step in which the photoresist film is dissolved.

FIG. 5(c) illustrates the thickness variation in the photoresist film 8, even on the mesa side walls 2a and 2b, that is a result of the non-planar structure. It is well known that there is a relationship between the width 1, as defined in FIG. 6(b), of an aperture photolithographically formed in a photoresist pattern and the thickness h, as defined in FIG. 6(b), of the resist. As shown in FIG. 6(a), the aperture width 1 varies significantly with the resist thickness h because of the wavelength of light used to pattern the photoresist. Therefore, variations in the film thickness, as in the photoresist film 8 of FIG. 5(c), cause wide variations in the gate pattern sizes, i.e., the widths of the recesses 10 of FIG. 5(d). As a result, the recesses 10 frequently fail to meet specifications as do the FETs incorporating gate electrodes 9.

FIGS. 7(a)–7(g) illustrate a prior art method of producing a semiconductor device that is disclosed in Japanese Published Patent Application 58-53842. In that method, an attempt is made to flatten the region in which an FET, other semiconductor device element, or another element is made in order to overcome the problems illustrated in FIGS. 5(a)–5(e), 6(a), and 6(b).

In FIG. 7(a), a silicon substrate 31 has a thermal oxide film 32 grown on it and patterned with a photoresist film 33 and conventional photolithographic techniques. As shown in FIG. 7(b), a photoresist film 33 is used as an etching mask and the substrate 31 is etched so that a three-dimensional feature is produced by reducing the substrate 31 in thickness beyond the oxide film 32. Boron ions for preventing field inversion are implanted in the silicon substrate using the resist film 33 as a mask to produce an ion implantation layer 34. As illustrated in FIG. 7(c), a silicon dioxide film 35 is deposited on the structure using a plasma chemical vapor deposition (CVD) method at a temperature below 350° C. The silicon dioxide film 35 is etched, as shown in FIG. 7(d), leaving a portion 36 on the photoresist film 33 and other discontinuous portions on the ion implanted layer 34. The silicon dioxide portion 36 is removed by dissolving the underlying photoresist film 33, i.e., by a lift-off step, to produce the structure shown in FIG. 7(e).

Another silicon oxide film 37 is then deposited on the structure to fill the voids 38a of the silicon dioxide film portions on the ion implanted layer 34. However, the shape of the voids 38a is generally replicated on the surface of the film 37 so that an additional film 39 for flattening the surface of the structure is deposited on the silicon oxide film 37. The film 39 has the same etching speed as that of film 37.

By exploiting that common etching speed of films 39 and 37, the films 39 and 37 are commonly etched to expose the portion of the silicon substrate 31 that was initially covered by the oxide film 32, as shown in FIG. 7(g). That substantially planar surface is then employed to produce a semiconductor device or semiconductor device element. Since no step, i.e., non-planar or three-dimensional feature, is present where the silicon substrate 31 is exposed, a photoresist film of uniform thickness can be easily deposited and dimensional errors or variations in the completed structures avoided. However, in order to produce the relatively planar surface, it is necessary to deposit the silicon oxide film 35 at a relatively high temperature, i.e., about 350° C., to cover the entire surface of the structure adequately. The elevated temperature thermally damages the resist film 33 so that it is difficult to lift-off the oxide portion 36. In addition, in order to carry out the lift-off process, it is only necessary to remove part of the silicon oxide film 35. However, in the etching of that continuous film, the voids 38a are formed. In order to provide a relatively planar surface for subsequent processing, those voids must be removed by depositing additional insulating films, such as films 37 and 39, followed by further etching. These additional steps complicate processing and increase its cost.

SUMMARY OF THE INVENTION

The present invention is directed to solving the above-described problems and has for its object the provision of a method for forming three-dimensional features on substrates with adjacent insulating films that may form substantially planar surfaces with a reduced number of process steps.

An aspect of the invention includes a method of producing a three-dimensional feature on a substrate and adjacent electrically insulating films comprising producing a resist on a portion of a surface of a substrate; etching the substrate to remove portions of the substrate not covered by the resist, leaving an etched surface on part of the substrate, and producing a three-dimensional feature having side walls intersecting the etched surface of the substrate underlying and undercutting the resist so that the resist includes overhanging portions spaced from the etched surface of the substrate, the three-dimensional feature having a height between the resist and the etched surface of the substrate; depositing, in a chemical vapor deposition process at a relatively low temperature, a discontinuous electrically insulating film to a thickness no greater than the height of the three-dimensional feature in a first segment on the resist and in a second segment discontinuous from the first segment, on the etched surface of the substrate adjacent the three-dimensional feature, including on the etched surface of the substrate between the etched surface of the substrate and the overhanging portions of the resist; and lifting off the resist and the first segment of the insulating film disposed on the resist to produce a flattened surface including the second segment of the insulating film and the three-dimensional feature.

Another aspect of the invention includes a method of producing a three-dimensional feature on a substrate with adjacent electrically insulating films comprising depositing an opaque film on a transparent substrate; forming a plurality of spaced apart resist portions on the opaque film; etching the opaque film to remove portions of the opaque film not covered by the resist portions, exposing part of the substrate and undercutting the resist portions so that the resist portions include overhanging portions spaced from the transparent substrate without any of the opaque film therebetween; depositing, in a chemical vapor deposition process at a relatively low temperature, a discontinuous transparent electrically insulating film to a desired thickness no greater than the thickness of the opaque film in first segments on the respective resist portions and in second segments, discontinuous from the first segments, on the exposed part of the substrate between remaining portions of the opaque film, including on the exposed part of the substrate between the exposed portion of the substrate and the overhanging portions of the resist portions; and lifting off the resist portions and the first segments of the insulating film disposed on the resist portions.

A further aspect of the invention includes a method of producing three-dimensional interconnected wiring on a substrate comprising depositing a first metal film and a second metal film on a substrate; producing a resist on a portion of the second metal film; etching the second metal film using the resist as a mask, leaving a portion of the second metal film on the first metal film between the first metal film and the resist; depositing, in a chemical vapor deposition process at a relatively low temperature, a discontinuous electrically insulating film to a thickness approximately equal to and no greater than the thickness of the second metal film in a first segment on the resist and in a second segment, discontinuous from the first segment, on the first metal film; lifting off the resist and the first segment of the insulating film; and depositing a third metal film on the second segment of the insulating film and on the remaining portion of the second metal film, thereby electrically connecting the third metal film to the first metal film.

Other objects and advantages of the present invention will become apparent from the detailed description. The detailed description and specific embodiments are provided for illustration only, since various additions and modifications within the spirit and scope of the invention will become apparent to those of skill in the art from the detailed description.

DETAILED DESCRIPTION OF THE PREFERRED EMBODIMENTS

Figure 1A:
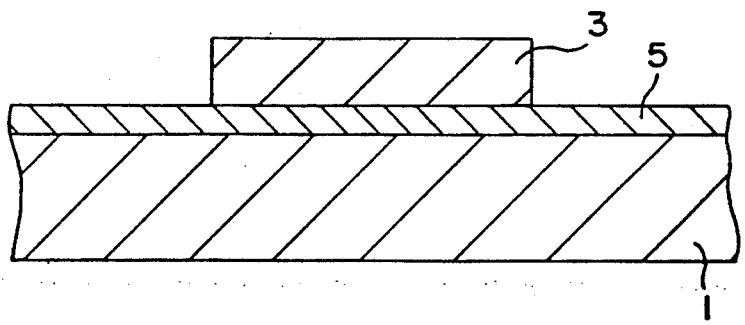
FIGS. 1(a)–1(g) are cross-sectional views illustrating a method according to the invention.
Figure 5A:
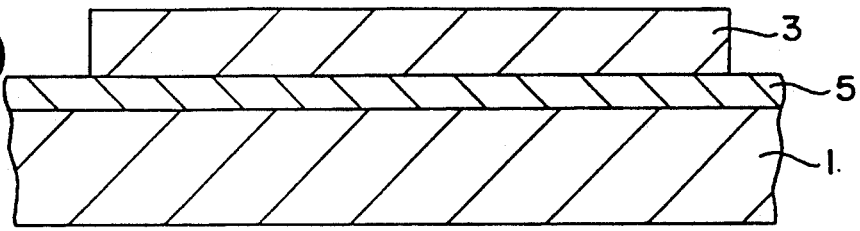
FIGS. 5(a)–5(e) are cross-sectional views illustrating a method according to the invention.
Figure 5B:
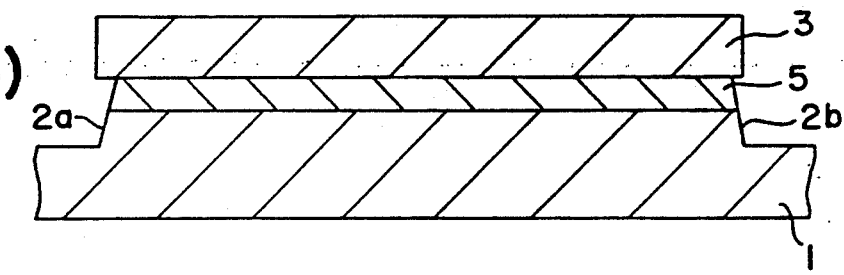
Figure 5C:
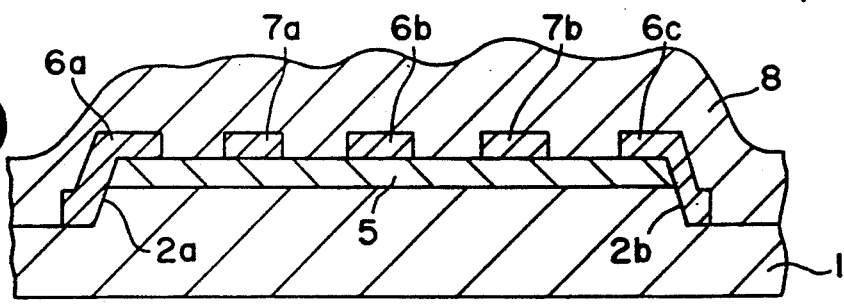
Figure 5D:
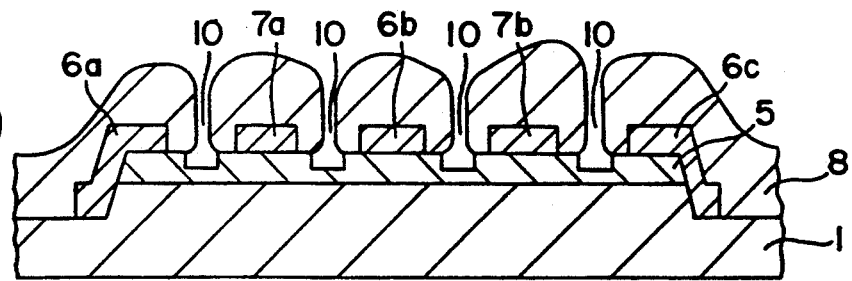
Figure 5E:
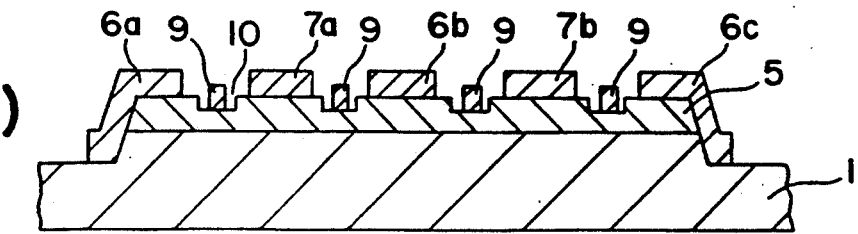
Figure 6A:
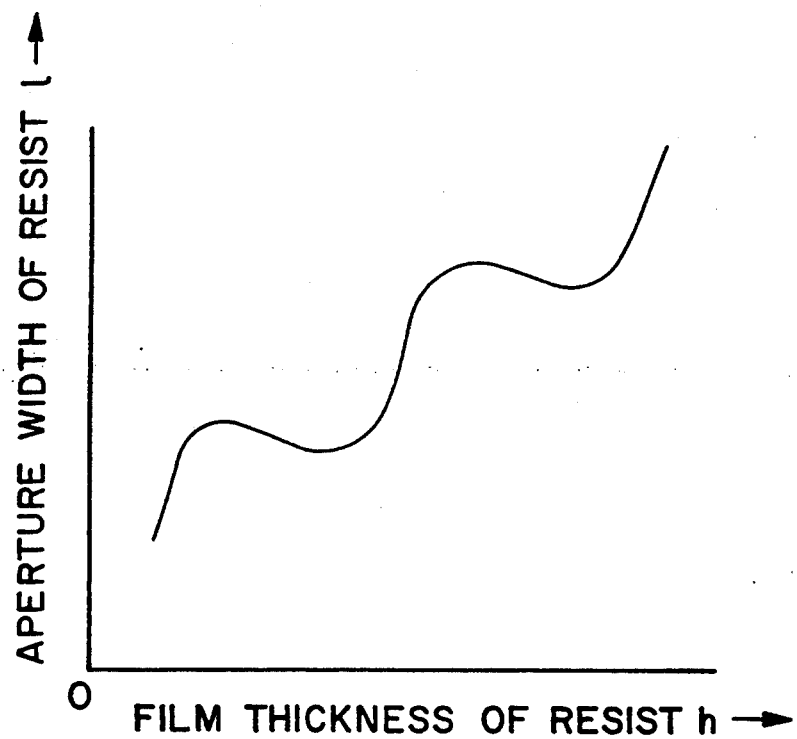
FIGS. 6(a) is a diagram showing a relationship between the aperture width 1 of an aperture in a resist film and the resist film thickness h and FIG. 6(b) is a cross-sectional view defining the resist film thickness h and the width 1 of an aperture in the resist film.
Figure 6B:
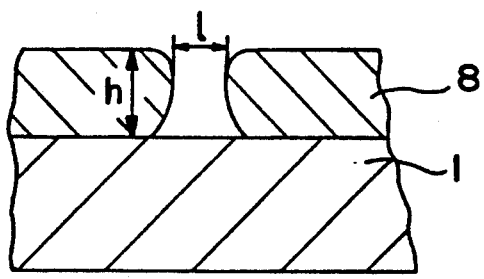
Figure 7A:
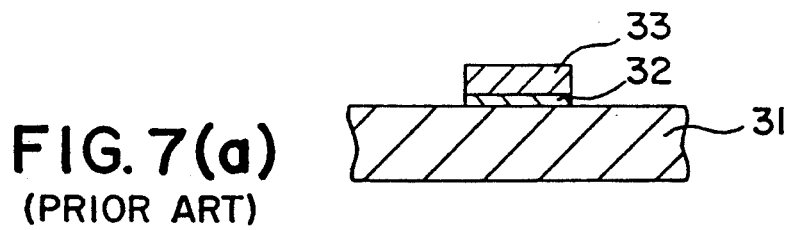
FIGS. 7(a)–7(g) are cross-sectional views illustrating a method according to the prior art.
Figure 7B:
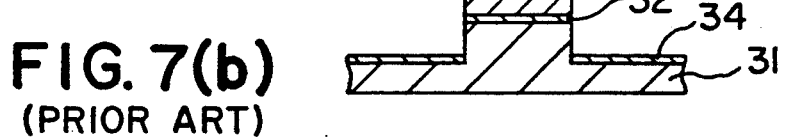
Figure 7C:
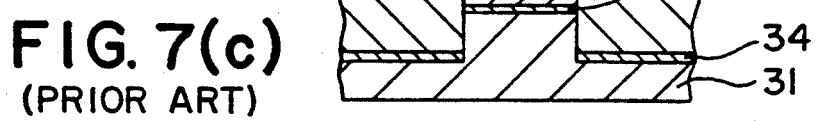
Figure 7D:
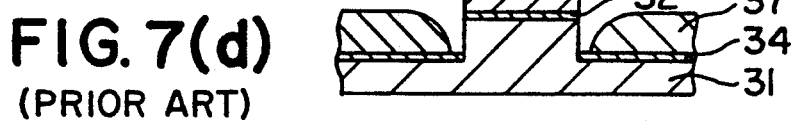
Figure 7E:
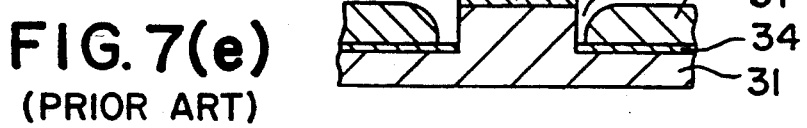
Figure 7F:
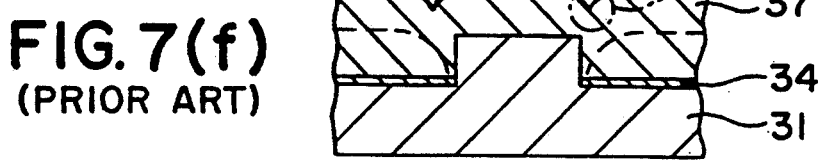
Figure 7G:
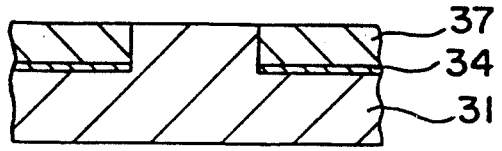

FIGS. 1(a)–1(g) illustrate a method of producing an MMIC according to the invention. In all figures, the same elements are given the same reference numbers. The structure of FIG. 1(a) is identical to the structure of FIG. 5(a). A gallium arsenide substrate 1 includes an active layer 5 on a portion of which a photoresist film 3 is disposed.

Figure 1B:
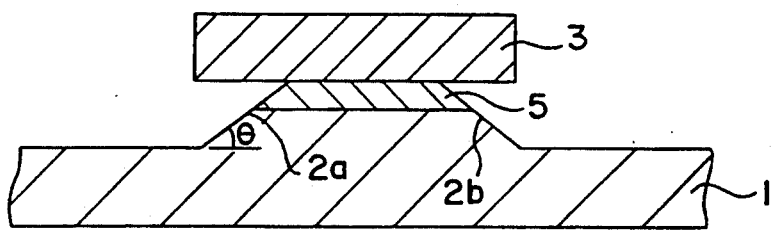
Figure 1C:
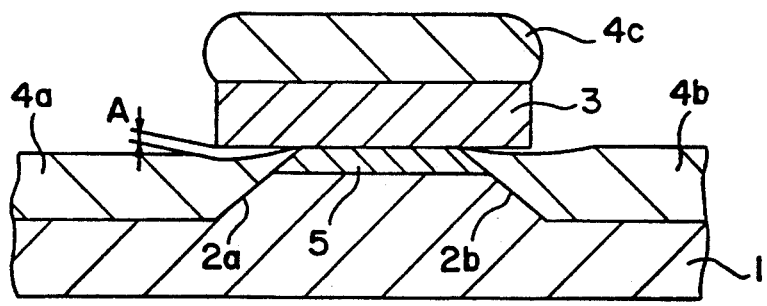
Figure 1D:
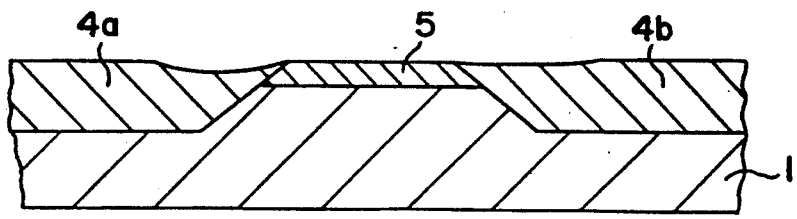

As shown in FIG. 1(b), the substrate 1 and the active layer 5 are etched with tartaric acid using the resist film 3 as a mask to produce a three-dimensional feature, a forward mesa having side walls 2a and 2b. on the substrate 1. The angle between the side wall 2a and the etched surface of the substrate 1 beyond the mesa varies depending upon the etchant and substrate employed to form the forward mesa. In one example, the mesa may have a height of about one micron and the angle $\theta$ may be about thirty-five degrees. An important feature of the invention illustrated in FIG. 1(b) is the overhanging of the photoresist film above the mesa side walls 2a and 2b. The overhanging portions of the photoresist film extend beyond the mesa like eaves on a roof. The overhanging portions are important in subsequent processing steps Next, as shown in FIG. 1(c), an insulating film 4 is deposited by a CVD method at a relatively low temperature (0° C. to 150° C. and, most preferably, at room temperature), for example, in a plasma by electron cyclotron resonance CVD (ECRCVD). Typically, a silicon oxide film deposited as the insulating film 4 is deposited at a gas pressure of about $10^{-3}$ Torr from a mixture of silane and oxygen in a ratio of about 3 to 5 with an input power at a microwave frequency of about 600 watts. The insulating film 4 is deposited to a thickness less than or equal to the height of the mesa relative to the etched surface of the substrate 1. Preferably, the thickness of the insulating film 4 is equal to the height of the mesa. When the insulating film 4 is deposited to the desired thickness, it is not deposited as a continuous film over all of the substrate and the photoresist film 3. Instead, the film 4 includes three separate segments. The segment 4a is disposed on one of the etched surfaces of the substrate 1, segment 4b is disposed on another of the etched surfaces of the substrate 1, and segment 4c is disposed on the photoresist film 3. In the specified low temperature film deposition process, the insulating film 4 is even deposited on the etched surfaces of the substrate 1 underneath the overhanging portions of the photoresist film 3, i.e., on the mesa side walls 2a and 2b. Generally, a gap A is left between the photoresist film 3 and the insulating film segments 4a and 4b. Gap A is less than about one hundred nanometers and is usually about twenty nanometers.

In order to provide a relatively flat surface for subsequent processing, i.e., a surface defined by the remaining portion of the active layer 5 and the insulating film portions 4a and 4b, the photoresist film 3 and the overlying portion 4c of the insulating film 4 are removed by dissolving the photoresist film 3. Because of the discontinuities in the insulating film 4, i.e., the existence of the disconnected film segments 4a, 4b, and 4c, the photoresist film solvent can easily reach the photoresist film 3 for completion of the lift-off step to produce the structure of FIG. 1(d). Moreover, because the insulating film 4 was deposited at a temperature no higher than 150° C., there has been no thermal deterioration of the photoresist film 3 that might interfere with its removal. The substrate 1 thus includes the mesa as a three-dimensional feature with adjacent insulating film segments 4a and 4b.

Figure 1E:
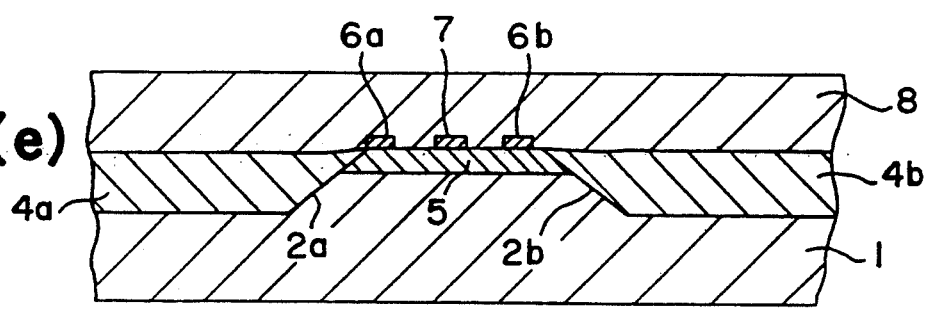
Figure 1F:
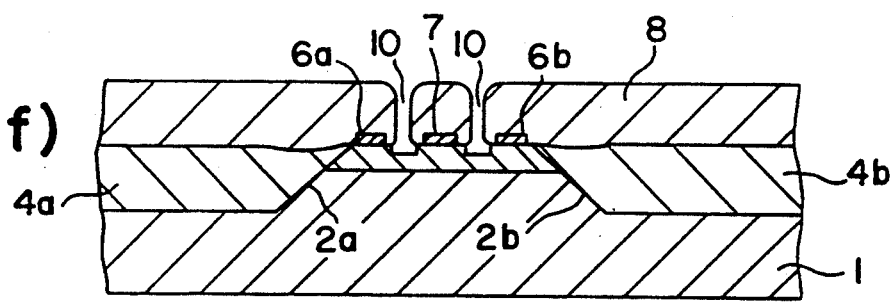

As shown in FIG. 1(e), after source electrodes 6a and 6b and drain electrodes 7, which are about seventy nanometers thick, are deposited on the active layer 5, a photoresist film 8 is deposited on the entire surface, i.e., on the insulating film segments 4a and 4b and the active layer 5, to a thickness of about 0.6 microns. The photoresist film 8 is patterned and developed using conventional processing techniques to provide access to the active layer 5 between the respective source and drain electrodes. The active layer 5 is etched through the mask to produce the recesses 10 shown in FIG. 1(f).

Figure 1G:
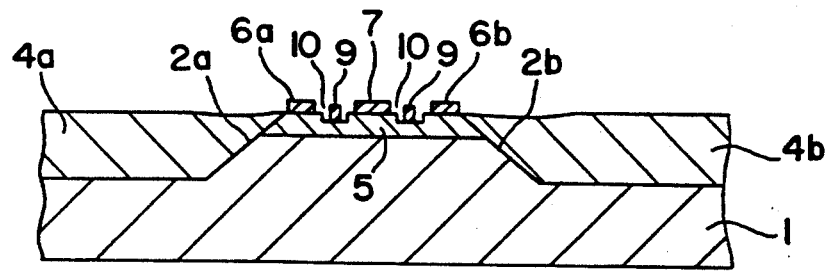

Finally, a metal for forming gate electrodes is vapor deposited in the recesses 10 and on the photoresist film 8, followed by a subsequent lift-off step, to produce an FET, as shown in FIG. 1(g).

The embodiment described with respect to FIGS. 1(a)–1(g) employs a gallium arsenide substrate, but other semiconductor substrates may be employed in the invention. Moreover, although the resist films have been described as photoresists, other resist films, such as an electron beam resist, a focused ion beam resist, an x-ray resist, a photosensitive polyimide, or another type of film responding to particular irradiation may be used in place of the photoresist films 3 and 8.

The invention may be applied to structures other than semiconductor devices such as the FET of FIG. 1(g). For example, the invention can be applied to the production of a phase-shifting mask employed in photolithographic processing of semiconductor devices, particularly with very small elements. An example of such a process is shown in FIGS. 2(a)–2(e).

Figure 2A:
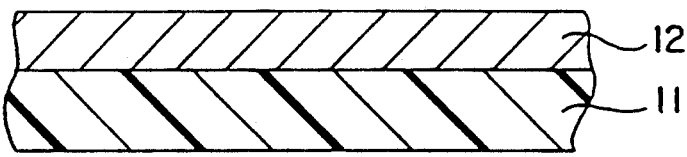
FIGS. 2(a)–2(e) are cross-sectional views illustrating a method according to the invention.

In FIG. 2(a), a non-semiconducting substrate 11 has disposed on it a film 12. When a phase-shifting mask is being prepared, the substrate 11 must be transparent to the light that will be employed with the mask and is usually a glass, such as quartz. The film 12 must be opaque to the light that will be employed with the mask and may be a metal, such as chromium, or a metal silicide, such as molybdenum silicide.

Figure 2B:
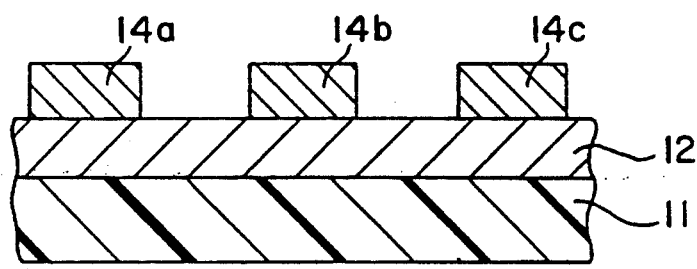

In the step illustrated in FIG. 2(b), a photoresist film 14 (not shown) has been deposited on the film 12 and patterned to produce three spaced apart portions 14a, 14b, and 14c.

Figure 2C:
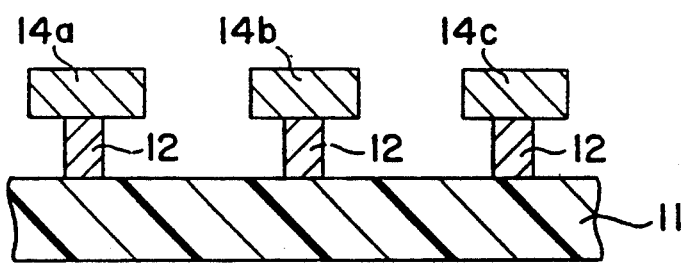

In the step illustrated in FIG. 2(c), the film 12 is etched using the resist portions 14a–14c as masks. Three-dimensional features, i.e., film portions 12a–12c of the film 12, are left beneath the mask portions 14a–14c, respectively. The etching is carried out for a sufficiently long time so that the mask portions 14a–14c are undercut, i.e., so that each of the mask portions 14a–14c includes parts overhanging the respective film portions 12a–12c just as portions of the resist film 3 overhang the mesa in the step illustrated in FIG. 1(b).

Figure 2D:
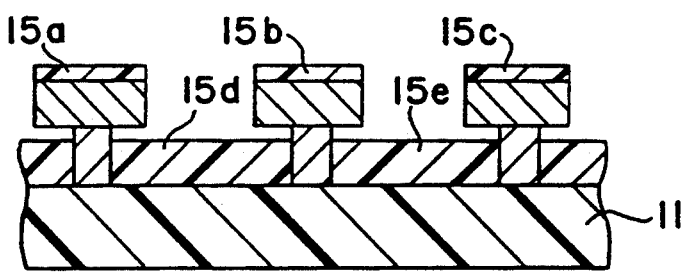

In FIG. 2(d), an electrically insulating film 15 is deposited in a low temperature CVD process, preferably by ECRCVD at a temperature between 0° C. and 150° C., preferably at about room temperature. The film 15 is deposited not only on the mask portions 14a–14c but is also deposited between the film portions 12a–12c on the substrate 11, even being deposited beneath the overhanging mask portions 14a–14c, just as the film portions 4a and 4b in FIG. 1(c) are deposited beneath the overhanging portions of the photoresist film 3. Insulating film segments 15a–15c are deposited on mask portions 14a–14c, respectively, and insulating film segments 15d and 15e are deposited directly on the substrate 11 between film portions 12a–12b and 12b–12c, respectively. The material deposited as the electrically insulating film 15 has a particular refractive index and is generally transparent to the light used with the phase-shifting mask. The thickness of the electrically insulating film 15 is controlled to provide a desired phase shift, usually an integer multiple of one quarter wavelength of the light used with the phase-shifting mask, considering the refractive index of the film 15. As in the process illustrated in FIG. 1(c), in the process illustrated in FIG. 2(d), the thickness of the electrically insulating film 15 does not exceed the thickness of the metal film 12 so that the film segments 15a–15e remain respectively discontinuous from each other.

Figure 2E:
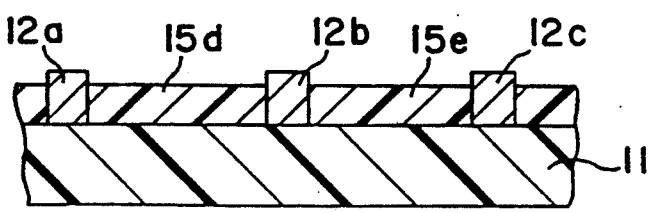

Finally, as illustrated in FIG. 2(e), the photoresist portions 14a–14c are removed by liftoff, producing a phase-shifting mask having at least one three-dimensional feature, film portion 12b, with adjacent insulating films, film portions 15d and 15e. It may be desirable to employ additional steps to remove certain of the phase-shifting film portions so that the mask has desired optical properties.

The invention may be applied to still other structures where it is desirable to form generally flat surfaces and/or to provide interconnections between certain layers of a multiple layer structure. Examples of such applications in metallizations are illustrated in FIGS. 3(a)-3(e) and 4(a)-4(d).

Figure 3A:
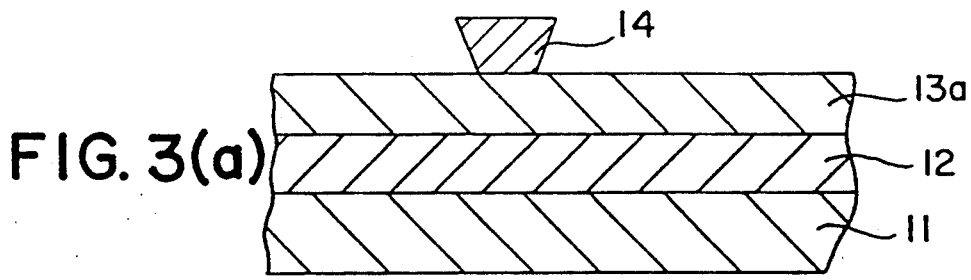
FIGS. 3(a)–3(e) are cross-sectional views illustrating a method according to the invention.

In FIG. 3(a), first and second metal films 12 and 13a are successively deposited on a substrate 11, such as an electrically insulating substrate, a semi-insulating semiconductor substrate, or another semiconductor substrate, and a photoresist mask 14 having a reverse mesa cross-section is produced at a desired location on the metal film 13a. The reverse mesa structure of the photoresist mask 14 means that the side walls of the mask converge in the direction of the substrate 11.

Figure 3B:
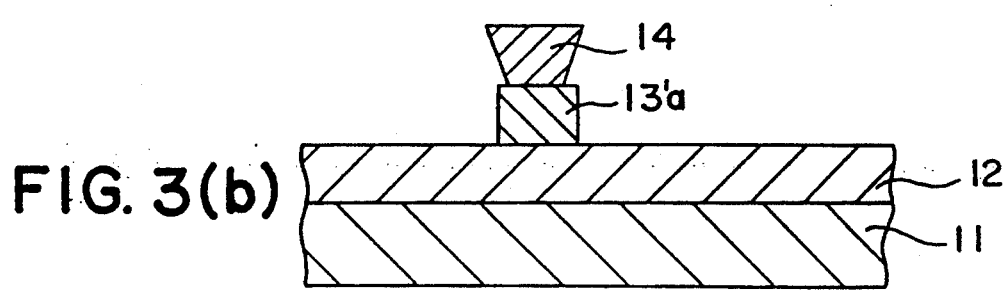

As shown in FIG. 3(b), using the photoresist mask 14 as an etching mask, the second metal film 13a is etched, leaving a portion 13a, as a three-dimensional feature on the substrate 11 and layer 12 directly below the mask 14. As shown in FIG. 3(b), because of the reverse mesa structure of the mask 14, the side walls of the metal film portion 13a, protrude slightly outwardly from the interface of the mask 14 and metal portion 13a'.

Figure 3C:
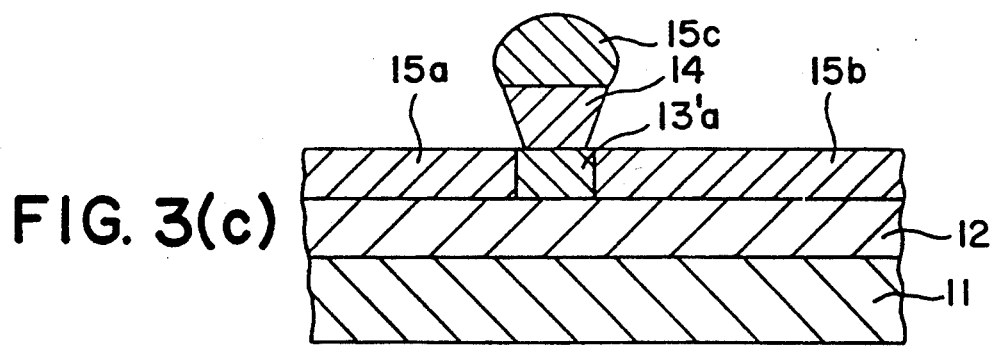

An electrically insulating film 15 is deposited at a low temperature, for example, by the ECRCVD method at a temperature between 0° C. and 150° C., and preferably at room temperature. The film 15 is deposited to a thickness approximately equal to the thickness of the metal film 13a so that discontinuous segments of the film 15 are established. As shown in FIG. 3(c), film segments 15a and 15b are disposed on the first metal film 12 on opposite sides of the metal film portion 13a' and insulating film portion 15c is deposited on the top of the mask 14.

Figure 3D:
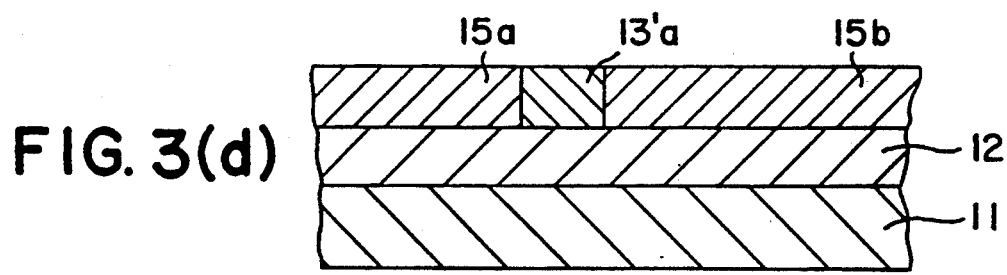

As illustrated in FIG. 3(d), the insulating film portion 15c is removed by lifting off the mask 14, leaving a relatively flat surface including the insulating film portions 15a and 15b and the metal film portion 13a'. The structure of FIG. 3(d) includes film portion 13a' as a three-dimensional element and insulating film segments 15a and 15b adjacent to the three-dimensional feature.

Figure 3E:
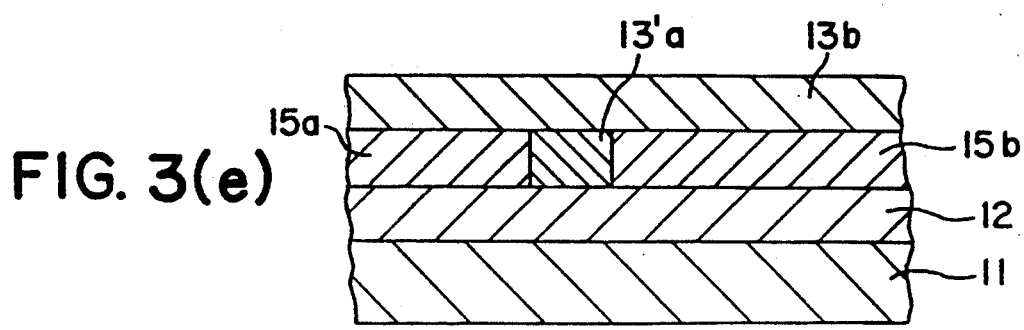

Finally, in FIG. 3(e), a third metal film 13b is deposited on the substantially flat surface so that an electrical connection between films 12 and 13b is provided by the metal film portion 13a'. The third metal film 13b is relatively planar, avoiding steps or other features that may interfere with making the desired electrical connections.

Figure 8A:
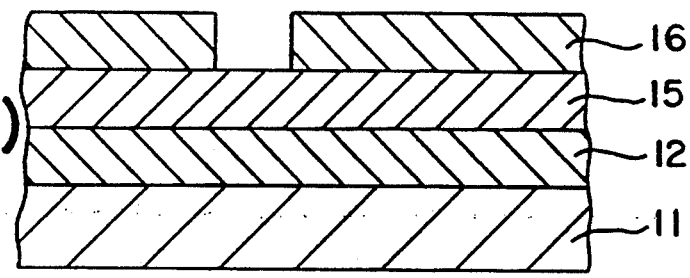
FIGS. 8(a)–8(c) are cross-sectional views illustrating a method according to the prior art.
Figure 8B:
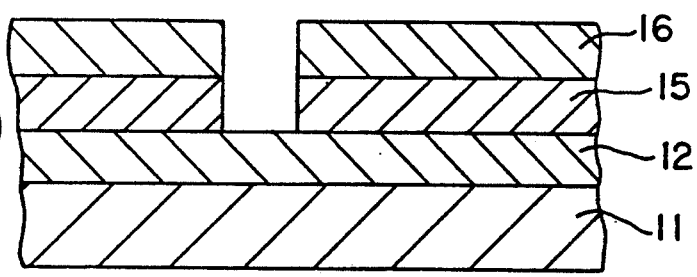
Figure 8C:
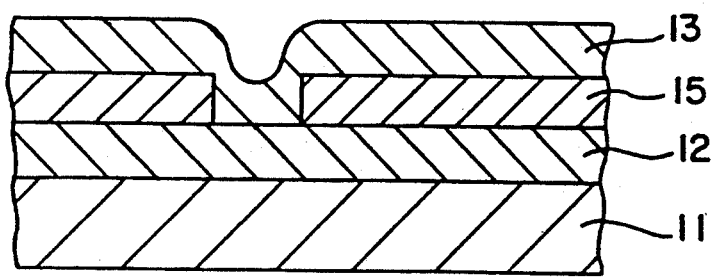

The desirable result achieved in the process shown in FIGS. 3(a)-3(e) is illustrated by a comparison with a prior art method shown in FIGS. 8(a)-8(c). There, a mask 16 is employed to remove a portion of the electrically insulating film 15 and thereby expose the underlying first metal layer 12. These masking and etching steps are illustrated in FIGS. 8(a) and 8(b). After the photoresist film 16 is removed, the third metal film 13 is deposited, as shown in FIG. 8(c). Because a portion of the third metal film 13 fills the opening in the electrically insulating film 15, the surface of the third metal film 13 is non-planar which can interfere with subsequent processing and even result in discontinuities in the third metal film 13. In order to reduce the probability of such discontinuities, the area of the opening in the insulating film 15 should be increased. However, as that area increases, the lack of substantial planarity in the surface of the third metal film also increases and valuable area and space are consumed.

By contrast, in the method according to the invention, since the metal portion 13a' is deposited before the third metal film 13b is deposited, the non-planarity problems are avoided and substantially planar, multiple layer wiring with interconnections between the mutually insulated layers can be made without significant risk of discontinuities in the wiring.

Figure 4A:
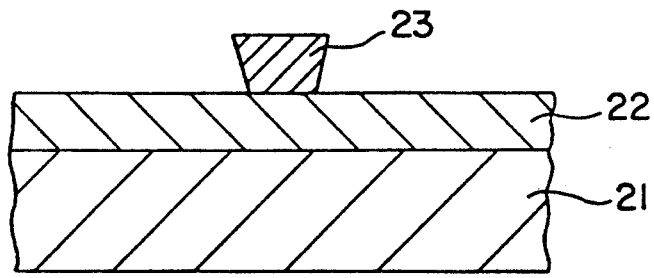
FIGS. 4(a)–4(d) are cross-sectional views illustrating a method according to the invention.

FIGS. 4(a)-4(d) illustrate another embodiment of the invention. As shown in FIG. 4(a), a substrate 21, which may be electrically insulating, a semi-insulating semiconductor, or another semiconductor, is covered by a film 22 of a metal, such as aluminum, that can be reactive ion etched. A mask 23 having a reverse mesa cross-section is disposed on a portion of the metal layer 22.

Figure 4B:
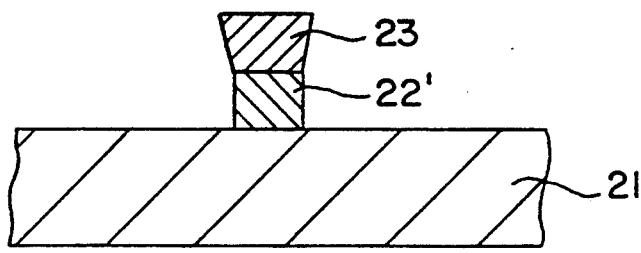

The metal layer 22 is etched, as illustrated in FIG. 4(b), for example, by reactive ion etching, leaving a portion 22' of the metal film disposed between the mask 23 and the substrate 21. The metal layer portion 22' is a three-dimensional feature on the substrate 21.

Figure 4C:
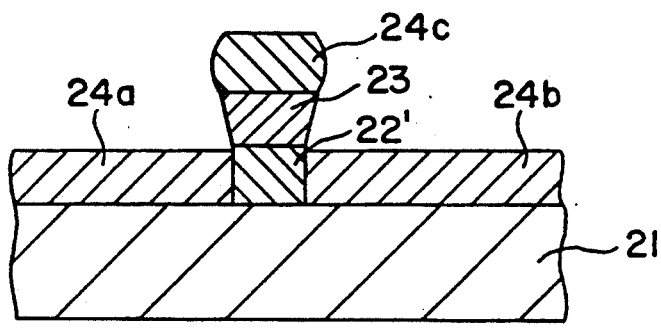

As in the other embodiments of the invention, in FIG. 4(c), an electrically insulating film 24 is deposited to a thickness substantially equal to and no greater than the thickness of the metal film portion 22'. The film 24 includes discontinuous segments 24a and 24b disposed directly on the substrate 21 on opposite sides of the metal film portion 22' and a segment 24c on the mask 23. The film 24 is deposited at a low temperature, for example, 0° C. and 150° C. 0. C., and preferably at room temperature, in a CVD process, preferably ECRCVD.

Figure 4D:
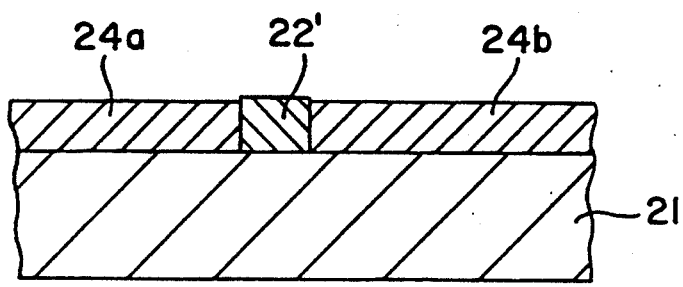

The insulating film segment 24c is removed in a lift-off step in which the mask 23 is dissolved to produce the structure shown in FIG. 4(d). That structure includes the three-dimensional feature 22' on the substrate 21 with adjacent insulating film segments 24a and 24b. The structure has a relatively flat, i.e., planar, surface, simplifying subsequent processing steps in the production of a semiconductor device or of another article.

In each of the embodiments of the invention described, a three-dimensional feature having side walls is produced on a substrate. Those side walls intersect the substrate, sometimes obliquely, as in the embodiment of FIGS. 1(a)-1(g), and sometimes nearly perpendicular or perpendicular to the substrate, as in the embodiments of FIGS. 2(a)-2(d) and 3(a)-3(e). Sometimes the three-dimensional features are part of the substrate, as in the embodiment of FIGS. 1(a)-1(g), and sometimes the three-dimensional features are materials different from the substrate, as in the embodiments of FIGS. 2(a)-2(d) and 3(a)-3(e). The invention provides an effective and reliable method of producing three-dimensional features with adjacent insulating films regardless of these differences.

I claim:

1. A method of producing a three-dimensional feature on a substrate and adjacent electrically insulating films comprising:

producing a resist on a portion of a surface of a substrate;

etching the substrate to remove portions of the substrate not covered by the resist, leaving an etched surface on part of the substrate, and producing a three-dimensional feature having side walls intersecting the etched surface of the substrate underlying and undercutting the resist so that the resist includes overhanging portions spaced from the etched surface of the substrate, the three-dimensional feature having a height between the resist and the etched surface of the substrate;

depositing, in an electron cyclotron resonance chemical vapor deposition process at a temperature below 150° C., a discontinuous electrically insulating film to a thickness no greater than the height of the three-dimensional feature in a first segment on the resist and in a second segment, discontinuous from the first segment, on the etched surface of the substrate adjacent the three-dimensional feature, and including on the etched surface of the substrate between the etched surface of the substrate and the overhanging portions of the resist; and lifting off the resist and the first segment of the insulating film disposed on the resist to produce a flattened surface including the second segment of the insulating film and the three-dimensional feature.

2. The method of claim 1 including depositing the insulating film to a thickness equal to the height of the three-dimensional feature.

3. The method of claim 1 wherein the insulating film deposited on the etched surface of the substrate between the etched surface of the substrate and the overhanging resist portions is not in contact with the overhanging resist portions.

4. The method of claim 1 including depositing the insulating film at room temperature.

5. The method of claim 1 wherein the resist is selected from the group consisting of photoresist, electron beam resist, focused ion beam resist, x-ray resist, and photosensitive polyimide.

6. The method of claim 1 wherein the substrate is a single crystal semiconductor substrate including etching the semiconductor substrate with a preferential etch to produce a mesa having side walls oblique to the etched surface of the substrate as the three-dimensional feature.

7. The method of claim 6 including:
depositing a source electrode and a drain electrode on the mesa;
depositing a photoresist film on the mesa, source and drain electrodes, and insulating film;
forming at least one aperture in the photoresist film extending to the mesa between the source and drain electrodes;
depositing a metal on the photoresist film and on the mesa through the aperture as a gate electrode; and
lifting off the photoresist film and the metal disposed thereon.

8. A method of producing a three-dimensional feature on a substrate and adjacent electrically insulating films comprising:
depositing an opaque film on a transparent substrate;
forming a plurality of spaced apart resist portions on the opaque film;
etching the opaque film to remove portions of the opaque film not covered by the resist portions, exposing part of the substrate and undercutting the resist portions so that the resist portions include overhanging portions spaced from the transparent substrate without any of the opaque film therebetween;
depositing, in a chemical vapor deposition process at a relatively low temperature, a discontinuous transparent electrically insulating film to a thickness producing a desired phase shift in incident light and no greater in thickness than the thickness of the opaque film in first segments on the respective resist portions and in second segments, discontinuous from the first segments, on the exposed part of the substrate between remaining portions of the opaque film, including on the exposed part of the substrate between the exposed portion of the substrate and the overhanging portions of the resist portions; and lifting off the resist portions and the first segments of the insulating film disposed on the resist portions.

9. The method of claim 8 wherein the insulating film deposited on the exposed part of the substrate between the substrate and the overhanging resist portions is not in contact with the overhanging resist portions.

10. The method of claim 8 including depositing the insulating film at a temperature below 150° C.

11. The method of claim 8 including depositing the insulating film at room temperature.

12. The method of claim 8 including depositing the insulating film by electron cyclotron resonance chemical vapor deposition.

13. The method of claim 8 wherein the resist is selected from the group consisting of photoresist, electron beam resist, focused ion beam resist, x-ray resist, and photosensitive polyimide.

14. The method of claim 8 wherein the transparent substrate is a glass, such as quartz, and the opaque film is selected from the group consisting of chromium and molybdenum silicide.

15. The method of producing three-dimensional interconnected wiring on a substrate comprising:
depositing a first metal film and a second metal film on a substrate;
producing a resist on a portion of the second metal film;
etching the second metal film using the resist as a mask, leaving a portion of the second metal film on the first metal film between the first metal film and the resist;
depositing, in an electron cyclotron resonance chemical vapor deposition process at a temperature below 150° C., a discontinuous electrically insulating film to a thickness approximately equal to and no greater than the thickness of the second metal film in a first segment on the resist and in a second segment, discontinuous from the first segment, on the first metal film;
lifting off the resist and the first segment of the insulating film disposed on the resist; and
depositing a third metal film on the second segment of the insulating film and on the remaining portion of the second metal film, thereby electrically connecting the third metal film to the first metal film.

16. The method of claim 15 including depositing the insulating film at room temperature.

* * * * *